(12) United States Patent
Kim et al.

(10) Patent No.: US 6,784,694 B2
(45) Date of Patent: Aug. 31, 2004

(54) CMOS SEQUENTIAL LOGIC CONFIGURATION FOR AN EDGE TRIGGERED FLIP-FLOP

(75) Inventors: Chulwoo Kim, Austin, TX (US); Sung-Mo Kang, Santa Cruz, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/125,736

(22) Filed: Apr. 18, 2002

(65) Prior Publication Data

US 2003/0052716 A1 Mar. 20, 2003

Related U.S. Application Data

(60) Provisional application No. 60/292,474, filed on May 21, 2001.

(51) Int. Cl.$^7$ ............................................. H03K 19/096
(52) U.S. Cl. .............................. 326/95; 326/93; 326/98; 326/119
(58) Field of Search ............................. 326/95–98, 112, 326/119, 121

(56) References Cited

U.S. PATENT DOCUMENTS

| | | | |
|---|---|---|---|
| 6,218,879 B1 * | 4/2001 | Kilpatrick | 327/217 |
| 6,426,652 B1 * | 7/2002 | Greenhill et al. | 326/83 |
| 6,441,648 B1 * | 8/2002 | Hsu et al. | 326/98 |

OTHER PUBLICATIONS

V. Stojanovic et al., "Comparative Analysis of Master–Slave Latches and Flip–Flops for High–Performance and Low–Power Systems," *IEEE J. Solid–State Circuits*, vol. 34, No. 4, pp. 536–548, Apr. 1999.
C. Kim and S. M. Kang , "A Low–Swing Clock Double–Edge Triggered Flip–Flop," *2001 Symposium on VLSI Circuits Digest of Technical Papers*.
B. Kong et al., "Conditional–Capture Flip–Flop Technique for Statistical Power Reduction," *IEEE Int. Solid–State Circuits Conf.*, Feb. 2000, pp. 290–291.
J. Wang et al., "Design of a 3–V 300–MHz Low–Power 8–b x8–b Pipelined Multiplier Using Pulse–Triggered TSPC Flip Flops," *IEEE J. Solid–State Circuits*, vol. 35, No. 5, Apr. 2000, pp. 583–591.
E. Partovi et al., "Flow–Through Latch and Edge–Triggered Flip–Flop Hybrid Elements," *IEEE Int. Solid–State Circuits Conf.*, Feb. 1996, pp. 138–139.
H. Kojima et al. , "Half–Swing Clocking Scheme for 75% Power Saving in Clocking Circuitry," *IEEE J. Solid–State Circuits*, vol. 30, No. 4, Apr. 1995, pp. 432–435.
C. Kim et al., "A Low–Swing Clock Double Edge–Triggered Flip–Flop," *IEEE Symp. VLSI Circuits Dig. Tech. Papers*, Jun. 2001, 1999, pp. 2521–2526.
H.S. Kwon et al., "A New Single Clock Flip–Flop for Half–Swing Clocking," *IEICE Trans. Fundamentals*, vol. E82–A, No. 11, Nov. 1999, pp. 2521–2526.
H. Kawaguchi et al., "A Reduced Clock–Swing Flip–Flop (RCSFF) for 63% Clock Power Reduction," *IEEE J. Solid–State Circuits*, vol. 33, No. 5, May 1998, pp. 807–881.
F. Klass, "Semi–Dynamic and Dynamic Flip–Flops with Embedded Logic" *IEEE Symp. on VLSI Circ., Digest of Technical Papers*, Jun. 1998, pp. 108–109.

* cited by examiner

*Primary Examiner*—Anh Q. Tran
(74) *Attorney, Agent, or Firm*—Greer, Burns & Crain, Ltd.

(57) ABSTRACT

A CMOS sequential logic circuit for an edge triggered flip-flop to lower power consumption in very large scale integrated (VLSI) circuit designs is disclosed. The circuit includes a plurality of PMOS transistors and a plurality of NMOS transistors. The PMOS and NMOS transistors are matched and joined as a data-sampling front end and a data-transferring back end to provide an output based on an input signal fed to a pair of transistor gates. Outputs from the pair of transistor gates charge and discharge internal nodes which connect the data-sampling front end to the data-transferring back end. The internal nodes also include a first latch that connects to a first internal node, and a second latch that connects to a second internal node. The latches prevent a floating voltage state for each of the first and second internal nodes and reduce power consumption during flip-flop transitions.

37 Claims, 2 Drawing Sheets

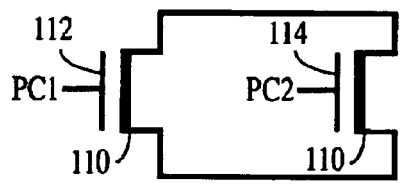
FIG. 2
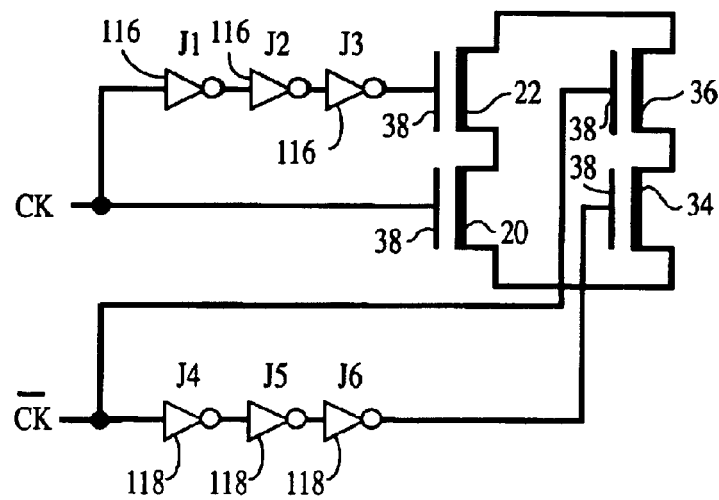
FIG. 3
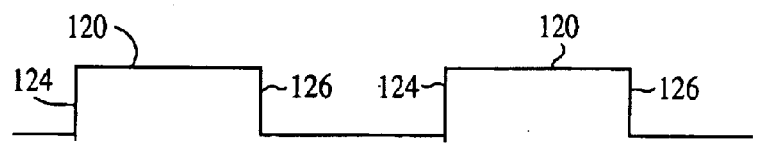
FIG. 4a CK
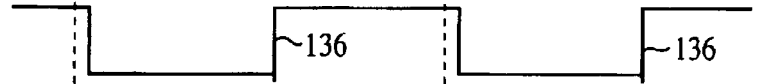
FIG. 4b CKb
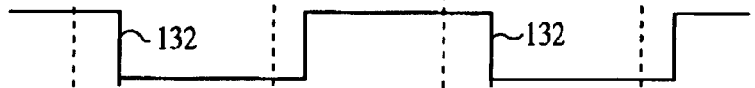
FIG. 4c CKd
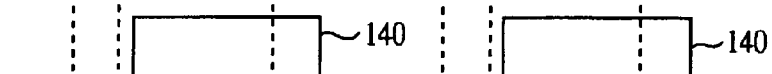
FIG. 4d CKdb
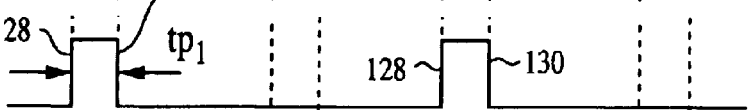
FIG. 4e PC1
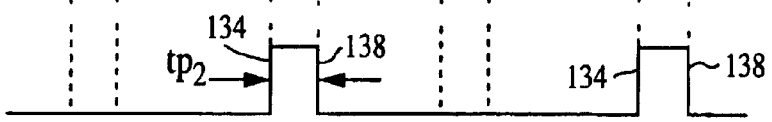
FIG. 4f PC2

CMOS SEQUENTIAL LOGIC CONFIGURATION FOR AN EDGE TRIGGERED FLIP-FLOP

CROSS-REFERENCE TO RELATED APPLICATIONS

The present Application claims priority under Title 35 U.S.C. § 119 on copending Provisional patent application Ser. No. 60/292,474, filed May 21, 2001.

FIELD OF THE INVENTION

The field of the invention is CMOS sequential logic. The invention finds particular use in CMOS microprocessor, ASIC, and DSP circuits.

BACKGROUND OF THE INVENTION

A flip-flop is an electronic circuit that stores a logical state of one or more data input signals in response to a clock pulse. Flip-flops are often used in computational circuits to operate in selected sequences during recurring clock intervals to receive and maintain data for a limited time period sufficient for other circuits within a system to further process data. At each rising or falling edge of a clock signal, data are stored in a set of flip-flops whose outputs are available to be applied as inputs to other combinatorial or sequential circuitry. Such flip-flops that store data on both the leading edge and the trailing edge of a clock pulse are referred to as double-edge triggered flip-flops.

In many very large scale integrated (VLSI) chips, the engineering design trend is to increase the pipeline stages for high throughput, which increases the number of flip-flops on a chip. This causes problems, though, because the power dissipation of the clocking system, including a clock distribution network and flip-flops is often the largest portion of total chip power consumption in VLSI chips due to the activity ratio of the clock signal being unity, and a significant increase in the interconnect line of clock trees.

In an ongoing desire to reduce power consumption in clock distribution networks, several small-swing clocking schemes have been proposed. Small-swing clocking schemes, however, have inherent disadvantages to designers since they require additional chip area during design. Additionally, four clock signals are required which can cause skew problems among the four clock signals. Furthermore, a reduced clock-swing clocking scheme requires an additional high substrate bias voltage to reduce the leakage current of the VLSI chip.

Other flip-flop designs such as a hybrid-latch flip-flop and a semi-dynamic flip-flop have also been proposed. These flip-flops operate faster than small-swing clocking schemed flip-flops, but also consume large amounts of power due to redundant transitions at internal nodes. Efforts to reduce the redundant power consumption and internal nodes of such flip-flops have led to the proposal of another type of flip-flop called the conditional capture flip-flop. Unfortunately, similar to the hybrid-latch flip-flop and the semi-dynamic flip-flop, the conditional capture flip-flop has a drawback of high power consumption in the clock tree since full-swing clock signals are required during operation.

SUMMARY OF THE INVENTION

A CMOS flip-flop circuit having a data-sampling front end and a data-transferring back end is provided by this invention. The front and back ends of the circuit are connected to one another between internal nodes charged and discharged according to an input data signal. The input data signal feeds a gate of an NMOS transistor as well as a gate of an PMOS transistor. Feeding a data input in this manner causes the internal nodes of the circuit to switch only when the input data signal changes, and not according to a clock signal inputted to the data-sampling front end. The flip-flop circuit further includes latches that prevent the internal nodes from having a floating voltage state, which reduces malfunction of the circuit.

In accordance with another aspect of the present invention, a new CMOS dynamic logic configuration for an edge triggered flip-flop includes a plurality of PMOS transistors and a plurality of NMOS transistors. The PMOS and NMOS transistors are matched and joined as a plurality of separate gate inputs and provide an output based on an input signal fed to a pair of transistor gates. A clock signal feeds a plurality of low threshold voltage NMOS transistors to trigger the flip-flop. Outputs from the pair of transistor gates define a first node and a second node, which have internal voltages. A first latch connected to the first node and a second latch connected to the second node have respective reference voltage sources to prevent a floating voltage state for each of the first and second nodes, and reduce power consumption during operation of the flip-flop.

BRIEF DESCRIPTION OF THE DRAWINGS

FIG. 2 illustrates an alternative embodiment clocking schematic for the edge triggered flip-flop of FIG. 1;

FIG. 3 illustrates another alternative embodiment clock schematic for the edge triggered flip-flop of FIG. 1; and FIGS. 4a–f illustrate the clocking scheme for the clocking schematics of FIGS. 1 and 2.

DETAILED DESCRIPTION OF THE PREFERRED EMBODIMENTS

Figure 1:
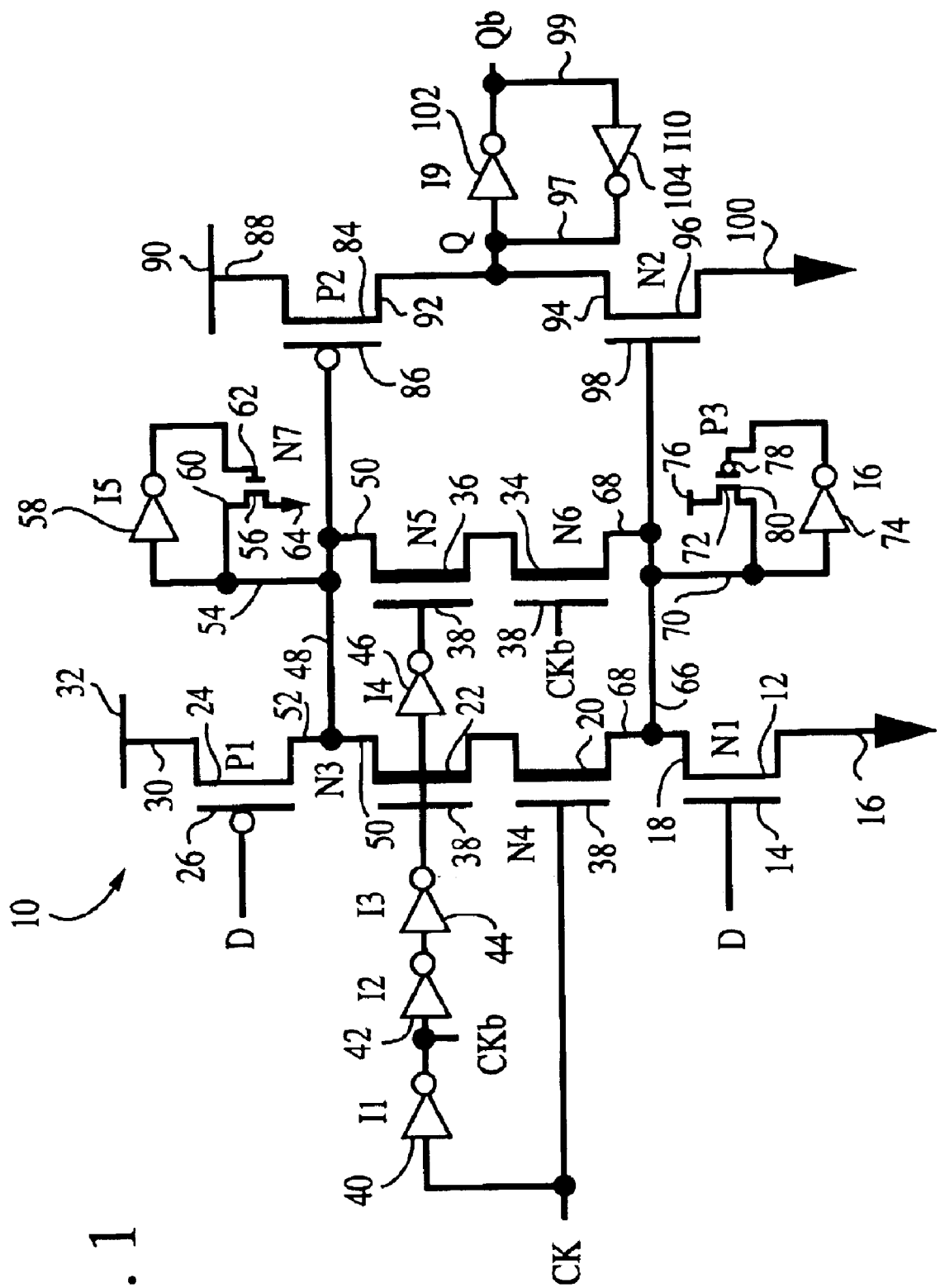
FIG. 1 illustrates a preferred embodiment CMOS dynamic logic configuration for an edge triggered flip-flop of the invention.

As VLSI chip designs become more complex, new circuit designs that have reduced power dissipation are desired. For many VLSI chip designs, a majority of the total chip power consumed is by the clocking system and associated clock distribution system. Thus, it is advantageous to have an improved edge triggered flip-flop as disclosed herein which provides a means for reducing power consumption in the clock distribution system. In particular, an advantage of the disclosed flip-flop design is that the use of additional flip-flops to pipeline stages for high throughput, as commonly occurs in VLSI chip design, is not needed resulting in less power consumption.

In accordance with the present invention, a CMOS dynamic logic configuration for an edge triggered flip-flop comprises a plurality of PMOS transistors and a plurality of NMOS transistors matched and joined as a plurality of separate gate inputs. The logic configuration also includes an output, a first node, and a second node, wherein the first and second nodes define an internal voltage between input transistors and output transistors. Further, the invention has a first latch that connects to the first node, and a second latch that connects to the second node. The use of latches provides for a more stable environment for the flip—flip, and reduces power consumption. The first and second latches connect to separate reference voltage sources, which prevent the internal nodes from having a floating voltage state. Moreover, the flip-flop has a reduced clock swing which further reduces power consumption.

In accordance with another aspect of the present invention, a method of producing a circuit output signal in a CMOS flip-flop circuit at one or more edges of a clock input signal is disclosed. The method includes the step of generating an input signal to input transistors having a plurality of low threshold voltage transistors connected therebetween, wherein the plurality of low threshold voltage transistors are configured to receive a clock signal. The method also includes the step of generating node signals from the input transistors to latches connected to the internal nodes of the CMOS flip-flop circuit. The latches prevent the internal nodes from having a floating voltage state, reduce power consumption, and facilitate generation of a circuit output signal.

Turning now to the drawings, FIG. 1 shows one embodiment of a CMOS dynamic logic configuration for a double-edge triggered flip-flop circuit 10 according to a first embodiment of the invention. The exemplary D flip-flop circuit 10 includes a high threshold voltage input NMOS transistor 12 that receives a data input signal at a gate 14. A source 16 of the input NMOS transistor 12 is connected to ground. The NMOS transistor also has a drain 18 that is cascaded with a low threshold NMOS transistor 20, low threshold voltage NMOS transistor 22, and high threshold input PMOS transistor 24. The data input signal is also fed into a gate 26 of PMOS transistor 24. One advantage of inputting a data signal in this manner is that the data signal charges and discharges internal nodes of the flip—flip circuit 10, which is preferred over using clocked pulse schemes to perform a similar function. The flip-flop also has a source 30 of PMOS transistor 24 fed by a high voltage source 32.

The flip-flop 10 includes NMOS low threshold voltage clock input transistors 34, 36 which are in parallel with NMOS low threshold voltage clock input transistors 20, 22. Each of the low threshold voltage NMOS transistors 20, 22 and 34, 36 receive clock inputs at different time intervals, resulting in different "turn on" times for each of the transistors to be in an active state. The pairs of low threshold voltage NMOS transistors 20, 22 and 34, 36 form a cascade between high threshold voltage PMOS transistor 24 and high threshold voltage NMOS transistor 12. Implementing an arrangement of this type permits the use of both edges of a clock pulse and effectively lowers the clock frequency to half of what is needed if a single edge of a clock pulse was utilized to "turn on" the low threshold voltage NMOS transistors. In the circuit, each of the NMOS low threshold voltage transistors 22, 24 and 34, 36 of the flip-flop 10 have gates 38 configured to receive a clock signal. In a preferred embodiment, the clock signal is generated by a single power source and comprises a continuous pulse train configured to feed four NMOS transistors, wherein three of the four NMOS transistors receive time delayed clock signals from one or more inverters.

In one embodiment, the clock signal CK is initially inputted into NMOS transistor 20. A second delayed clock signal CKb is received at NMOS transistor 34 after passing though an inverter 40 that also inverts the clock signal CK. After passing through inverter 40, the initial clock signal CK is passed through a second inverter 42 and a third inverter 44 and then fed as a third clock signal CKd into NMOS transistor 22. A fourth inverter 46 inverts clock signal CKd from the third inverter 44 and feeds a fourth clock signal CKdb into NMOS transistor 36. The use of multiple inverters with the clock signal CK provides delayed clock signals to three of the four low threshold voltage transistors, with two of the three delayed clock signals inverted by 180° as compared to the initial clock signal CK.

The flip-flop also includes a first internal node 48 that connects NMOS transistor 36 and NMOS transistor 22 via their respective drains 50 to a drain 52 of PMOS transistor 24. A first latch 54 is connected to the first internal node 48 and includes a high threshold voltage latch NMOS transistor 56 and a high threshold voltage first latch inverter 58. The first latch 54 lowers malfunction of the flip-flop 10, and assists with internal current flow. Input from the drain 52 of PMOS transistor 24 is transmitted along first node 48 to the first latch 54 and fed into the inverter 58 and a drain 60 of NMOS transistor 56. NMOS transistor 56 also includes a gate 62 and a source 64. The gate 62 receives the output from inverter 58 and the source 64 connects to a low voltage reference source (not shown). Implementation of the first latch 54 prevents the first internal node 48 from floating or having a floating voltage state during circuit operation while not interrupting the intended current flow of the flip-flop circuit 10, thus reducing the latency and power consumption of the flip-flop 10.

Still referring to FIG. 1, a second internal node 66 connects sources 68 of NMOS transistor 20 and NMOS transistor 34 to the drain 18 of NMOS transistor 12. The second internal node 66 is also connected to a second latch 70 which has a high threshold voltage latch PMOS transistor 72 and a high threshold voltage second latch inverter 74. Once again, the use of the second latch 70 lowers malfunction of the flip-flop 10, and assists with internal current flow through the second internal node 66. The source 76 of PMOS transistor 72 is connected to a high voltage reference source (not shown). Similar to the first latch 54, output from the inverter 74 connects to a gate 78 of PMOS transistor 72. Input from the second internal node 66 feeds directly into a drain 80 of PMOS transistor 72. The second latch 70 prevents floating or a floating voltage state of the second node 66 similar to the first latch's operation. Thus, the second latch 70 acts in conjunction with the first latch 54 to further reduce latency and power consumption of the flip-flop 10.

The first internal node 48 of the flip-flop 10 further connects to a gate 86 of the PMOS transistor 84, which also includes a source 88 connected to a high voltage source 90. A drain 92 of PMOS transistor 84 connects to a drain 94 of high threshold voltage NMOS transistor 96, and provides a circuit output signal at output node 97. The circuit output signal is determined by the charging and discharging of the internal nodes, which are regulated by the initial inputting of the data input signal into the flip-flop circuit. A gate 98 of NMOS transistor 96 connects to the second node 66, and a source 100 connects to a second low voltage reference source (not shown). A second circuit output signal can also be detected. The drain 92 of PMOS transistor 84 feeds into a first output inverter 102 having an inverted circuit output signal at output node 99. The inverted output signal is then fed into a second output inverter 104, which connects to output node 97.

In one embodiment, the flip-flop 10 has a data sampling front end that includes PMOS transistor 24, NMOS transistors 12, 20–22 and 34–36, and inverters 40–46. The flip-flop also has a data transferring back end that includes PMOS transistor 84, NMOS transistor 96, and inverter 102. Internal nodes 48, 66 connect to respective first and second latches 54, 70 and are charged and discharged according the input data signal received by the gate 14 of NMOS transistor 12 and the gate 26 of PMOS transistor 24. As previously discussed, latches 54, 70 prevent the nodes 48, 66 from floating, and assist with internal node current flow in the flip-flop 10.

FIGS. 4a–f illustrate one embodiment of a low clocking swing scheme for the circuit configuration of FIG. 1, and an alternate embodiment pulsed clocking scheme discussed more fully with reference to FIG. 2. The low swing clock signal CK comprising a pulse train is initiated and includes pulses 120 and 122. Each of the pulses 120, 122 has a rising edge 124 and a falling edge 126 that are used for double-edge triggering of the flip-flop 10 of FIG. 1. CKb illustrates the inversion and delay of the low swing clock pulse prior to being inputted into low threshold voltage NMOS transistor 34. CKd further illustrates the additional time delay of the clock pulse upon passing through an additional two inverters prior to being inputted into low threshold voltage NMOS transistor 22. Finally, CKdb illustrates the time delay and clock signal inversion upon input of the low swing clock pulse into low threshold voltage NMOS transistor 36.

FIGS. 2 and 3 illustrate alternative clock feeding embodiments for the present invention. In FIG. 2, the four low threshold voltage NMOS transistors 20, 22 and 34, 36 of FIG. 1 are replaced with a pair of low threshold voltage NMOS transistors 110 having independent pulse-clock generated signals inputted into gates 112, 114 of the pair of NMOS transistors 110. The pulse-clock generated signals are configured to lead or lag one another to provide proper "turn on" of the four low threshold voltage NMOS transistors 20, 22 and 34, 36 as discussed with reference to FIGS. 4a–f.

FIG. 3 illustrates an arrangement wherein the four low threshold voltage NMOS transistors 20, 22 and 34, 36 again receive clock inputs at their respective gates 38. In this clocking scheme, two independent clock signals are used, with one signal being an inverted signal of the other. This clocking scheme has an advantage of reducing timing skew as compared to the other disclosed embodiments, and a disadvantage of using more power during operation. In this clocking scheme, NMOS transistor 20 receives a non-inverted clock signal, and NMOS transistor 22 is configured to receive the non-inverted clock signal after inversion by three low threshold voltage inverters 116 connected in series, which delay the signal. NMOS transistor 36 receives a separate inverted clock signal. The inverted clock signal is also fed into NMOS transistor 34 after passing through three low threshold voltage inverters 118 connected in series.

In addition to the four inverter clocking scheme implemented in FIG. 1, FIGS. 4a–f illustrate a pulsed clock scheme which can be implemented by generating two pulse trains PC1 and PC2. The first pulse train PC1 has rising edges 128 coinciding with the rising edges 124 of CK and falling edges 130 coinciding with falling edges 132 of CKd. The second pulse train PC2 has rising edges 134 coinciding with rising edges 136 of CKb and falling edges 138 coinciding with falling edges 140 of CKdb. Each of the clock input schemes of the present invention makes the flip-flop circuit sensitive to both edges of the clock signal CK, and allows the overall system clock rate to be cut and/or performance to increase as compared to single-edge triggered flip-flops. As such, the system can be used for various functions such as counter circuits, shift registers, etc.

In operation, prior to the rising edge 124 of the clock signal CK, NMOS transistors 20, 22 and 34, 36 are "turned off" or in an inactive state. At the rising edge 124 of the clock signal CK, NMOS transistors 20, 22 are turned on for a short time duration $t_{p1}$ to sample data. At the falling edge 126 of the clock signal CK, NMOS transistors 34, 36 are "turned on" to sample data for time duration $t_{p2}$. When the input changes to "high" at gate 14, the second node 66 is discharged to "low" through NMOS transistor 12 and the first node 48 retains the previous data value, "high". After the rising edge of CK, NMOS transistors 20, 22 are "turned on" and the first node is discharged to "low". The first node drives the gate 86 of PMOS transistor 84, which in turn charges the output node 97 to "high". When the input changes to "low", the first node is charged to "high" by PMOS transistor 24 and the second node retains the previous data value "low". After the rising edge 124 of the clock signal CK, NMOS transistors 20, 22 are "turned on" and the second node 66 is charged by PMOS transistor 72. The second node 66 drives the gate 98 of NMOS transistor 96 which discharges the output node 97 to "low". Operation at the falling edge 126 of the clock signal CK occurs in a similar manner.

In alternative embodiments, NMOS transistor 56 and PMOS transistor 72 can each be replaced by an inverter in series with inverter 58 and inverter 74, respectively. Moreover, each of the low threshold voltage transistors 40–46 can be replaced by high threshold voltage transistors. Furthermore, the clock signal can be a low swing clock pulse or a pulsed clock.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A CMOS circuit, comprising;
a data-sampling front end;
a data-transferring back end,
internal nodes connecting the data-sampling front end and the data-transferring back end, the internal nodes charged and discharged according to an input data signal;
a first latch connected to one of the internal nodes; and
a second latch connected to one of the internal nodes.

2. The CMOS circuit of claim 1 wherein a double-edge triggered clock signal is transmitted to the data-sampling front end.

3. The CMOS circuit of claim 2 wherein the clock signal is a pulsed clock signal.

4. The CMOS circuit of claim 2 wherein the clock signal is a low swing clock signal.

5. The CMOS circuit of claim 4 wherein the clock signal is transmitted to a plurality of one of low and high threshold voltage transistors.

6. The CMOS circuit of claim 1 wherein the first and second latches prevent a floating voltage state of the internal nodes.

7. The CMOS circuit of claim 1 wherein the internal nodes comprise a first node and a second node.

8. The CMOS circuit of claim 7 wherein the first node connects to the first latch and the second node connects to the second latch, the first and second latches configured to prevent floating voltage states for each of the first and second nodes.

9. The CMOS circuit of claim 4 wherein the double-edge triggered clock signal is fed into two cascaded pairs of the plurality of one of high and low threshold voltage transistors in parallel between the first and second nodes.

10. The CMOS circuit of claim 9 wherein a plurality of inverters delay the double-edge triggered clock signal to at least one cascaded pair of the plurality of one of high and low threshold voltage transistors.

11. The CMOS circuit of claim 1 wherein the input data signal is fed into two inputs of the data-sampling front-end, the two inputs including a gate of a high threshold voltage PMOS transistor and a gate of a high threshold voltage PMOS transistor.

12. An CMOS sequential logic configuration for an edge triggered flip-flop, comprising:
    at least one PMOS transistor and a plurality of NMOS transistors matched and joined as a plurality of separate gate inputs and including an output, a first node, and a second node, wherein the first and second nodes define an internal voltage between one or more input transistors and one or more output transistors;
    a first latch connected to the first node; and
    a second latch connected to the second node, wherein the first and second latches are connected to separate reference voltage sources to prevent a floating voltage state for each of the first and second nodes.

13. The logic configuration of claim 12 wherein the first latch includes a latch NMOS transistor connected to a first latch inverter.

14. The logic configuration of claim 13 wherein the second latch includes a latch PMOS transistor connected to a second latch inverter.

15. The logic configuration of claim 14 wherein the latch NMOS and PMOS transistors are high threshold voltage transistors.

16. The logic configuration of claim 14 wherein the one or more input transistors includes a high threshold voltage input NMOS transistor having a first input gate configured to receive a data input signal, and a high threshold voltage input PMOS transistor having a second input gate configured to receive the data input signal inverted.

17. The logic configuration of claim 16 wherein the first latch connects to a drain input of the high threshold voltage input PMOS transistor and the second latch connects to a drain input of the high threshold voltage input NMOS transistor.

18. The logic configuration of claim 12 wherein a double-edge triggered clock signal is provided to gate inputs of four NMOS transistors.

19. The logic configuration of claim 18 wherein the clock signal is inverted by 180° for two of the four low threshold voltage NMOS transistors.

20. A method of producing a circuit output signal in an CMOS flip-flop circuit in response to one or more edges of a clock input signal, comprising:
    generating an input signal to an PMOS transistor and an NMOS transistor having a plurality of transistors connected therebetween;
    providing a clock signal to at least one of the plurality of transistors;
    generating a first node signal from the PMOS transistor to a first latch and a second node signal from the NMOS transistor to a second latch, the first and second latches configured to prevent a floating voltage state for each of the first and second node signals; and
    wherein the first and second node signals generate the circuit output signal.

21. The method of claim 20 wherein the clock input signal is a low swing clock input signal.

22. The method of claim 20 wherein the clock input signal is a pulsed double-edge triggered clock signal.

23. The method of claim 20 wherein the plurality of transistors includes one of four low and four high threshold voltage NMOS transistors.

24. The method of claim 20 further comprising the step of supplying the clock signal to one of the low and high threshold voltage NMOS transistors and a delayed version of the clock signal to the other one of low and high threshold voltage NMOS transistors.

25. The method of claim 24 further comprising the step of providing an inverted clock signal to at least two of the threshold voltage NMOS transistors.

26. The method of claim 20 wherein the first latch includes a high threshold voltage NMOS transistor having a gate input connected to an output of a first latch inverter, the first latch inverter having an input connected to a drain of the high threshold voltage NMOS transistor.

27. The method of claim 26 wherein the second latch includes a high threshold voltage PMOS transistor having a gate input connected to an output of a second latch inverter, the second latch inverter having an input connected to a source of the high threshold voltage NMOS transistor.

28. The method of claim 20 wherein the CMOS flip-flop circuit is a D flip-flop circuit.

29. An CMOS cascaded circuit, comprising:
    means for generating a clock signal;
    means for delaying the clock signal to one or more clock input transistors;
    means for receiving an inverted input, the means for receiving an inverted input having a first node output;
    means for receiving an input, the means for receiving an input having a second node output; and
    means for controlling voltage levels of the first and second node outputs to generate a circuit output signal.

30. The CMOS cascaded circuit of claim 29 wherein the clock signal is a double-edge triggered clock signal.

31. The CMOS cascaded circuit of claim 30 wherein the clock signal is a low swing clock signal.

32. The CMOS cascaded circuit of claim 30 wherein the clock signal is pulsed clock signal.

33. The CMOS cascaded circuit of claim 31 wherein the one or more clock input transistors are low threshold voltage NMOS transistors.

34. The CMOS cascaded circuit of claim 29 wherein the means for controlling voltage levels includes a first latch connected to the first node output and a second latch connected to the second node output.

35. The CMOS cascaded circuit of claim 34 wherein the first and second latches include a high threshold voltage inverter connected to one of an PMOS transistor and an NMOS transistor.

36. The CMOS cascaded circuit of claim 29 wherein the means for delaying a clock signal includes one or more low threshold voltage inverters in series with at least one of the one or more clock input transistors.

37. The CMOS cascaded circuit of claim 29 wherein the means for receiving an inverted input is a high threshold voltage PMOS transistor and the means for receiving an input is a high threshold voltage NMOS transistor.

* * * * *